(12) United States Patent
Lee

(10) Patent No.: US 8,193,569 B2
(45) Date of Patent: Jun. 5, 2012

(54) NON-VOLATILE SEMICONDUCTOR MEMORY DEVICE HAVING ION CONDUCTIVE LAYER AND METHODS OF FABRICATING AND OPERATING THE SAME

(75) Inventor: Jung-hyun Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 24 days.

(21) Appl. No.: 11/508,991

(22) Filed: Aug. 24, 2006

(65) Prior Publication Data

US 2007/0045728 A1 Mar. 1, 2007

(30) Foreign Application Priority Data

Aug. 24, 2005 (KR) .................. 10-2005-0078038

(51) Int. Cl.
*H01L 29/76* (2006.01)
(52) U.S. Cl. ............ 257/300; 257/306; 257/401
(58) Field of Classification Search .......... 257/300, 257/306, 401
See application file for complete search history.

(56) References Cited

U.S. PATENT DOCUMENTS

| | | | | |
|---|---|---|---|---|
| 5,063,425 A * | 11/1991 | Yamauchi et al. | ............ | 257/298 |
| 5,185,689 A * | 2/1993 | Maniar | ............ | 361/313 |
| 5,498,888 A * | 3/1996 | Ozawa | ............ | 257/295 |
| 5,604,357 A * | 2/1997 | Hori | ............ | 257/24 |
| 5,856,688 A * | 1/1999 | Lee et al. | ............ | 257/295 |
| 5,917,230 A * | 6/1999 | Aldrich | ............ | 257/532 |
| 5,946,567 A * | 8/1999 | Weng et al. | ............ | 438/250 |
| 6,063,659 A * | 5/2000 | Le | ............ | 438/250 |
| 6,150,217 A * | 11/2000 | Chang et al. | ............ | 438/255 |
| 6,236,078 B1* | 5/2001 | Yoshida et al. | ............ | 257/306 |
| 6,391,708 B1* | 5/2002 | Liao | ............ | 438/253 |
| 6,649,954 B2* | 11/2003 | Cross | ............ | 257/295 |
| 6,807,079 B2 | 10/2004 | Mei et al. | | |
| 6,818,936 B2* | 11/2004 | Lin et al. | ............ | 257/300 |

(Continued)

FOREIGN PATENT DOCUMENTS

CN 1574363 2/2005

OTHER PUBLICATIONS

Chinese Office Action and English-language translation dated Mar. 11, 2009.

*Primary Examiner* — Eugene Lee
(74) *Attorney, Agent, or Firm* — Harness, Dickey & Pierce, P.L.C.

(57) ABSTRACT

A non-volatile semiconductor memory device having an ion conductive layer, and methods of fabricating and operating the same are disclosed. The non-volatile memory device may include a substrate, a switching element formed in the substrate, and a storage node connected to the switching element, the storage node may include a lower electrode connected to the switching element, and used as an ion source; a data storage layer formed on the lower electrode, a portion thereof being spaced from the lower electrode; a side electrode spaced from the lower electrode, a side surface thereof being connected to a portion of the data storage layer spaced from the lower electrode; and an upper electrode formed on the data storage layer, or may include a lower electrode connected to the switching element, and used as an ion source; and a data storage layer formed on the lower electrode; an upper electrode formed on the data storage layer.

42 Claims, 13 Drawing Sheets

U.S. PATENT DOCUMENTS

| | | | |
|---|---|---|---|
| 7,109,088 B2 * | 9/2006 | Yamamoto | 438/393 |
| 2002/0192919 A1 * | 12/2002 | Bothra | 438/381 |
| 2003/0129805 A1 * | 7/2003 | Kim | 438/386 |
| 2004/0084709 A1 * | 5/2004 | Kim et al. | 257/306 |
| 2004/0245557 A1 | 12/2004 | Seo et al. | |
| 2005/0064618 A1 | 3/2005 | Brown et al. | |

* cited by examiner

NON-VOLATILE SEMICONDUCTOR MEMORY DEVICE HAVING ION CONDUCTIVE LAYER AND METHODS OF FABRICATING AND OPERATING THE SAME

PRIORITY STATEMENT

This application claims priority under 35 U.S.C. §119 to Korean Patent Application No. 10-2005-0078038, filed on Aug. 24, 2005, in the Korean Intellectual Property Office (KIPO), the entire contents of which are incorporated herein by reference.

BACKGROUND

1. Field

Example embodiments relate to a non-volatile semiconductor memory device and methods of fabricating and operating the same. Other example embodiments relate to a non-volatile semiconductor memory device having an ion conductive layer illustrating different resistant characteristics in accordance with percolation diffusion, and methods of fabricating and operating the same.

2. Description of the Related Art

An improved semiconductor memory device may have characteristics of relatively easy recording and erasing, relatively low power consumption, a relatively high operating speed, a relatively high integration density, and an improved non-volatile property unlike some of the characteristics of a conventional semiconductor memory device (e.g., DRAM, SRAM, EEPROM, flash memory and/or any other suitable device). For example, the DRAM may have improved integration density, the SRAM may have improved operating speed, and the flash memory may have an improved non-volatile property.

With the increase in demand for an improved semiconductor memory device, a semiconductor memory device having the improved characteristics of both a conventional volatile memory device and a conventional non-volatile memory device (e.g., MRAM, PRAM, RRAM and/or FRAM) is being developed and studied.

FIG. 1 is a diagram illustrating an example of a storage node of a conventional non-volatile semiconductor memory device. Referring to FIG. 1, the storage node of the conventional non-volatile semiconductor memory device may include a copper (Cu) layer 10, a copper sulfide (CuS) layer 12, and a platinum/titanium aluminum nitride (Pt/TiAlN) layer 14 sequentially stacked. The copper layer 10, functioning as a lower electrode, may be connected to a transistor (not shown). The copper sulfide layer 12 may be used as an ion conductive layer in which resistance is varied in accordance with an ion concentration. The platinum/titanium aluminum nitride layer 14 may be used as an upper electrode. The conventional non-volatile semiconductor memory device may record bit data to the storage node and may read bit data from the storage node based on the variation in resistance of the copper sulfide layer 12. The variation in resistance of the copper sulfide layer 12 may depend on whether or not ions exist inside the copper sulfide layer 12.

FIG. 2 illustrates voltage-resistance characteristics of the storage node illustrated in FIG. 1. Graph line 11 of FIG. 2 illustrates that resistance of the storage node varies in accordance with voltage when a given concentration of ion exists in the copper sulfide layer 12. Graph line 13 illustrates variation in resistance of the storage node in accordance with voltage when ions do not exist in the copper sulfide layer 12. Comparing graph lines 11 and 13 of FIG. 2, there may be a difference between resistances of the storage node when a low voltage is applied to the storage node, but resistances of the storage node become about the same as the applied voltage is increased.

The resistance change in a conventional non-volatile memory device may occur relatively fast after the initial applied voltage. If the resistance change is relatively fast in accordance with an applied voltage, it may be difficult to provide a sufficient margin necessary for read and write operations.

SUMMARY

Example embodiments provide a semiconductor memory device capable of providing a sufficient margin in read and write operations by reducing resistance change in accordance with an applied voltage. Example embodiments also provide a method of fabricating and operating the semiconductor memory device.

According to example embodiments, there is provided a non-volatile memory device including a storage node. The storage node may include a lower electrode used as an ion source; a data storage layer formed on the lower electrode, a portion thereof being spaced from the lower electrode and at least one upper electrode formed spaced apart on the data storage layer. The non-volatile memory device may include at least one side electrode spaced from each other, the lower electrode and the at least one upper electrode and a side surface thereof being connected to a portion of the data storage layer spaced from the lower electrode. The non-volatile memory device may also include a first insulating layer disposed between the at least one side electrode and the lower electrode, which forms a stack structure, and a second insulating layer disposed between the at least one side electrode and the data storage layer. The first and second insulating layers may be silicon dioxide ($SiO_2$) layers. The data storage layer may extend onto the second insulating layer.

The non-volatile memory device may further include a substrate and a switching element formed in the substrate and connected to the storage node via the lower electrode. The data storage layer may be a compound layer including a transition metal and a Group V element. The compound layer may be any one of a $CuS_x$ layer ($0.4<x<0.6$), a tungsten oxide layer, and a titanium oxide layer. The data storage layer may be a tungsten (W) layer and/or a titanium (Ti) layer. The at least one side electrode and the at least one upper electrode may be noble metal layers, for example, platinum (Pt).

The data storage layer may include an protruding portion and the upper electrode may be formed on the protruding portion. An interlayer insulating layer may be further disposed on the data storage layer around the protruding portion, and the at least one side electrode may be connected to the data storage layer through the interlayer insulating layer. The data storage layer may extend onto the at least one side electrode. An insulating layer may be further disposed between the at least one side electrode and the lower electrode. The at least one upper electrode and the lower electrode may be spaced apart vertically and the at least one side electrode may be spaced apart horizontally.

According to other example embodiments, a method of fabricating a non-volatile memory device may include forming a lower electrode used as an ion source on an interlayer insulating layer; forming at least one layer on the lower electrode, removing a portion of the at least one layer so as to expose the lower electrode, forming a data storage layer covering at least one side surface of the at least one layer exposed by removing the portion of the at least one layer on the exposed portion of the lower electrode and forming at least one upper electrode spaced apart on the data storage layer. In example embodiments, the at least one layer may be a stack structure including a first insulating layer and at least one side electrode layer. The stack structure may also include a second insulating layer. The first and second insulating layers may be formed of silicon dioxide layers. In other example embodiments, the at least one layer may be an interlayer insulating layer. The method may also include forming a switching element connected to the lower electrode in a substrate and forming the interlayer insulating layer covering the switching element on the substrate.

The removing of the portion of the stack structure so as to expose the lower electrode may include forming a groove dividing the stack structure into two portions in the stack structure. The data storage layer may be formed to fill the groove. The data storage layer may also be formed on the at least one layer. The data storage layer may be a compound layer including a transition metal and a Group V element. The compound layer may be a $CuS_x$ layer. The lower electrode may be a transition metal layer and the at least one upper electrode may be a noble metal layer. The data storage layer may extend onto a portion of the at least one layer.

The forming of the at least one upper electrode on the data storage layer may further comprise forming an protruding portion in the data storage layer, forming an interlayer insulating layer on the data storage layer around the protruding portion, forming at least one via hole to be filled with the at least one upper electrode in the interlayer insulating layer and covering the protruding portion on the interlayer insulating layer, and removing the at least one upper electrode except for portions of the at least one upper electrode filling the at least one via hole, portions thereof around the at least one via hole, and a portion thereof covering the protruding portion.

According to other example embodiments, there is provided a method of writing and operating the non-volatile memory device comprising maintaining the switching element in an on-state and applying a write voltage between the at least one upper electrode and the lower electrode. Applying a write voltage between the at least one upper electrode and the lower electrode may record data in the data storage layer. Before applying the write voltage, an erase voltage may be applied. In example embodiments after applying the write voltage, the method may further comprise floating the lower electrode, and applying a read voltage between the at least one upper electrode and the lower electrode, thereby reading data recorded in the data storage layer. In other example embodiments after applying the write voltage, the method may further comprise floating the at least one upper electrode and the lower electrode and applying a read voltage between the at least one upper electrode and the lower electrode.

BRIEF DESCRIPTION OF THE DRAWINGS

Example embodiments will be more clearly understood from the following detailed description taken in conjunction with the accompanying drawings.

Figure 1:
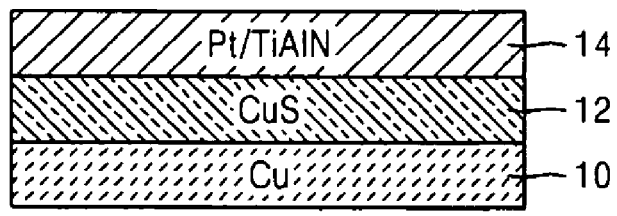
FIGS. 1-24 represent non-limiting, example embodiments as described herein.

It should also be understood that various cross-hatching patterns used in the drawings are not intended to limit the specific materials that may be employed in the present disclosure. The cross-hatching patterns are merely to distinguish between various layers illustrated within the drawings for purposes of clarity.

Figure 2:
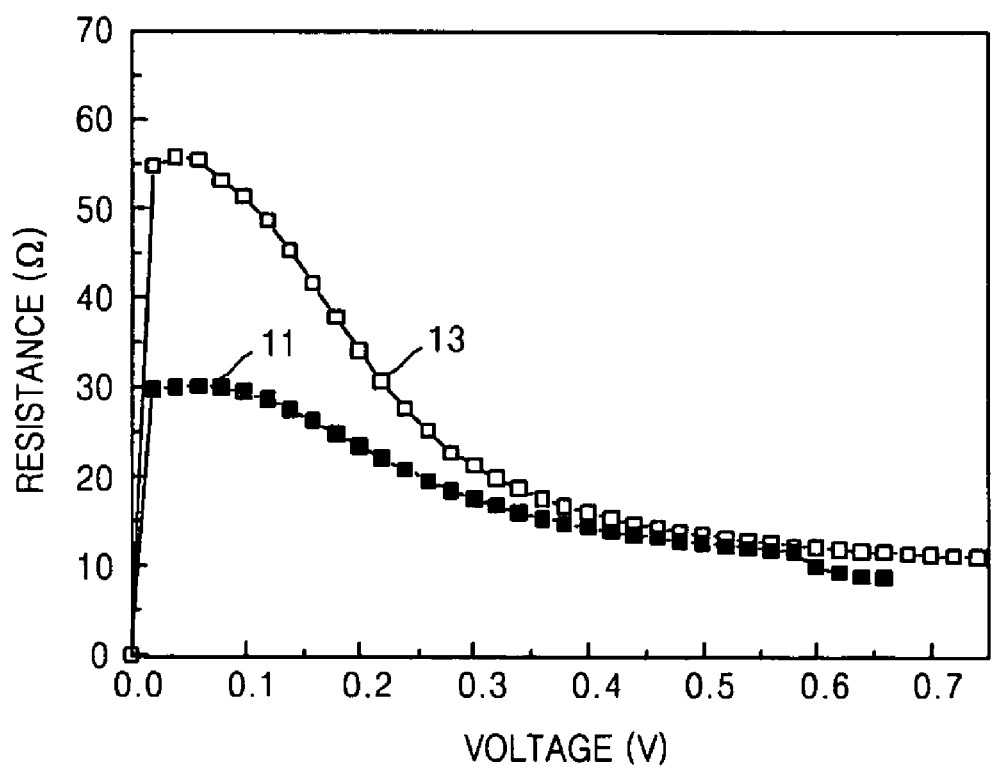
Figure 23:
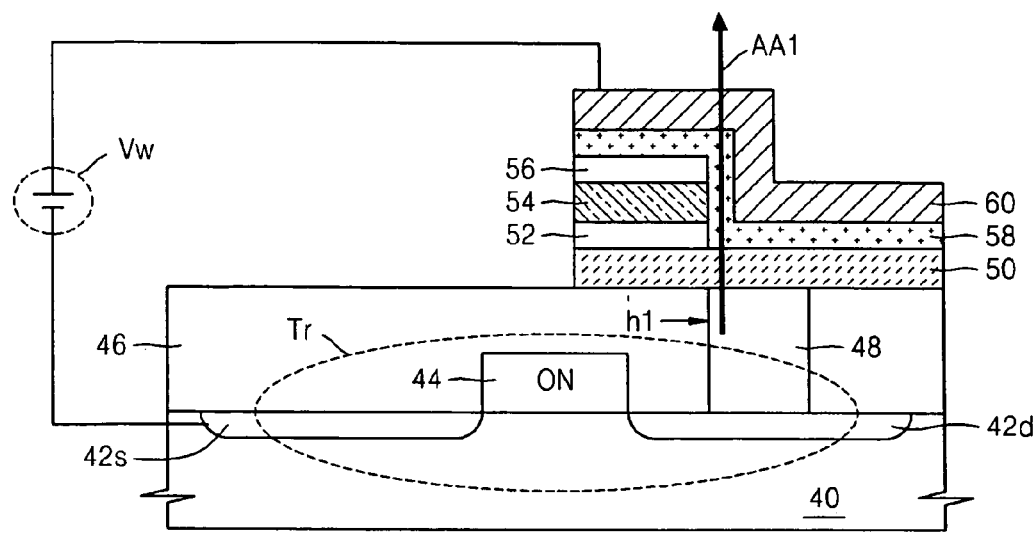
Figure 24:
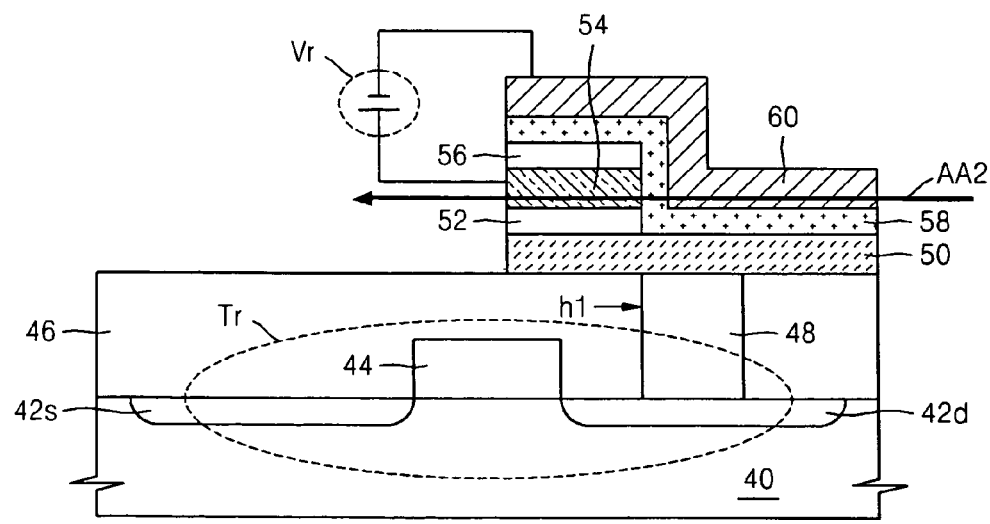

FIG. 1 is a diagram illustrating a structure of a storage node of a conventional non-volatile semiconductor memory device;

FIG. 2 is a graph illustrating a problem with the conventional semiconductor memory device having the storage node of FIG. 1;

FIGS. 3-7 are diagrams illustrating non-volatile semiconductor memory devices according to example embodiments;

FIGS. 8-12 are graphs illustrating electrical characteristics of a non-volatile semiconductor memory device according to example embodiments;

FIGS. 13-18 are diagrams illustrating a method of fabricating a non-volatile semiconductor memory device according to example embodiments in accordance with processing sequences;

FIGS. 19-22 are diagrams illustrating a method of fabricating a non-volatile semiconductor memory device according to other example embodiments in accordance with processing sequences;

FIG. 23 is a diagram illustrating a writing method of a non-volatile semiconductor memory device according to example embodiments; and FIG. 24 is a diagram illustrating a writing method of a non-volatile semiconductor memory device according to example embodiments.

DETAILED DESCRIPTION OF EXAMPLE EMBODIMENTS

Example embodiments will now be described more fully hereinafter with reference to the accompanying drawings, in which preferred embodiments are shown. Example embodiments may, however, be embodied in many different forms and should not be construed as being limited to the embodiments set forth herein. Rather, these example embodiments are provided so that this disclosure will be thorough and complete, and will fully convey the scope of example embodiments to those skilled in the art. In the drawings, the thicknesses of layers and regions are exaggerated for clarity. Like reference numerals refer to like elements throughout the specification.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" may encompass both an orientation of above and below. The device may be otherwise oriented (rotated 90° or at other orientations) and the spatially relative descriptors used herein interpreted accordingly.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3:
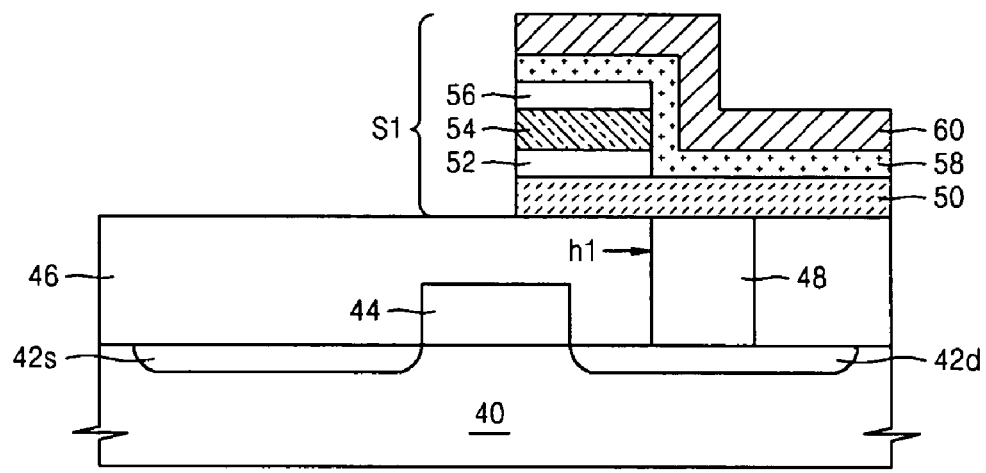

FIG. 3 is a diagram illustrating a non-volatile semiconductor memory device according to example embodiments. Referring to FIG. 3, the first memory device may include a semiconductor substrate 40. The semiconductor substrate 40 may be a p-type and/or n-type silicon substrate. First and second impurity regions 42s and 42d may be provided in the semiconductor substrate 40. The first and second impurity regions 42s and 42d may include impurities having a different polarity of conductivity from that of the impurities implanted into the substrate 40. One of the first and second impurity regions 42s and 42d may be a source region, and is the other may be a drain region. A gate stack 44 may be formed on the substrate 40 between the first and second impurity regions 42s and 42d. The gate stack 44 may include a gate oxide layer (not shown) and a gate electrode (not shown). The gate stack 44 and the first and second impurity regions 42s and 42d may constitute a field effect transistor (FET), which may be used as a switching element.

An interlayer insulating layer 46 may be formed on the substrate 40 to cover the FET and make the surface of the substrate flat. A contact hole h1 may be formed in the interlayer insulating layer 46 to expose the second impurity region 42d. The contact hole h1 may be filled with a conductive plug 48. A storage node S1 may be provided on the interlayer insulating layer 46 to cover the conductive plug 48. Bit data (e.g., 0 and/or 1) and/or multi-bit data (e.g., 00, 01, 10, and/or 11) may be recorded on the storage node S1. The storage node S1 may include a lower electrode 50 covering the conductive plug 48 and may be directly formed on the interlayer insulating layer 46. The lower electrode 50 may be an ion source and may be composed of a transition metal (e.g., copper (Cu), silver (Ag), and/or zinc (Zn)). A thickness of the lower electrode 50 may depend on the material used for the lower electrode 50. For example, a thickness of the lower electrode may be greater than about 100 nm if the lower electrode 50 is a copper electrode.

When a grain of the material used to form the lower electrode 50 is greater than a grain of the material used to form the conductive plug 48, the material of the conductive plug 48 (e.g., silicon (Si)) may be diffused into the lower electrode 50. A diffusion barrier layer (not shown) may be further provided between the lower electrode 50 and the conductive plug 48. A silicon oxide ($SiO_2$) layer may be used for the diffusion barrier layer.

A first insulating layer 52, a side electrode 54, and a second insulating layer 56 may be sequentially stacked on a portion of the lower electrode 50. The first insulating layer 52 retards or prevents contact between the lower electrode 50 and the side electrode 54. The first insulating layer 52 may be, for example, a silicon dioxide ($SiO_2$) layer. When the first insulating layer 52 is a silicon dioxide layer, a thickness of the first insulating layer 52 may be about 10 nm. The side electrode 54 may be used to read bit data recorded in the storage node S1 as well as the upper electrode 60. The side electrode 54 may be composed of a noble metal, for example, platinum (Pt). When the side electrode 54 is a platinum electrode (Pt), a thickness of the side electrode 54 may be about 100 nm. The second insulating layer 56 may be formed of the same material as that of the first insulating layer 52, but the second insulating layer 56 and the first insulating layer 52 may be formed of different material. A data storage layer 58 may be formed on the portion of the lower electrode 50 where the first insulating layer 52 is not formed. The data storage layer 58 may cover one sidewall of the first insulating layer 52, the side electrode 54, and the second insulating layer. An upper surface of the second insulating layer 56 may be covered with the data storage layer 58.

When the memory device illustrated in FIG. 3 is in a write operation, ions may be supplied from the lower electrode 50 as an ion source to the data storage layer 58. If the supplied ions reach a given concentration inside the data storage layer 58, resistance of the data storage layer 58 may be decreased to lower than that before the ions are supplied. Bit data 0 and/or 1 may be recorded on the data storage layer 58. Because the data storage layer 58 may have two or more resistance values in accordance with a concentration of supplied ions, each resistance value may correspond to multi-bit data. Thus, multi-bit data (e.g., 00, 01, 10, and/or 11) may be recorded on the data storage layer 58. The ion concentration inside the data storage layer 58 may stay relatively the same until an erase voltage is applied to the data storage layer 58. Thus, the bit data and/or multi-bit data recorded in the data storage layer 58 may not be volatilized until an erase voltage is applied.

The data storage layer 58 may be a compound layer including a transition metal (e.g., copper (Cu) and/or a Group VI element (e.g., sulfur (S)). An example of the data storage layer 58 may be a copper sulfide ($CuS_x$) layer. When the data storage layer 58 is a copper sulfide ($CuS_x$) layer, resistance of the data storage layer 58 may be decreased or increased in accordance with the value of subscript "x". Other examples of the data storage layer 58 may be a tungsten (W) layer, a tungsten oxide layer, (e.g., $WO_3$ layer), a titanium (Ti) layer, and/or a titanium oxide layer (e.g., $TiO_2$ layer). An upper electrode 60 may be provided on the data storage layer 58. The upper electrode 60 may be a noble metal layer (e.g., platinum (Pt)) and/or a multi-layer including a transition metal (e.g., a Pt/TiAlN layer).

Figure 4:
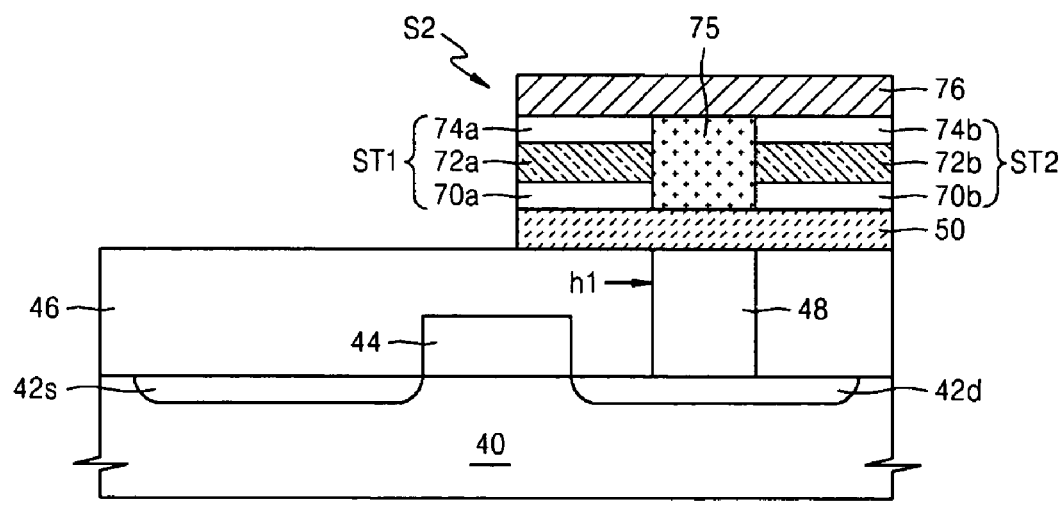

FIG. 4 is a diagram illustrating a non-volatile semiconductor memory device according to other example embodiments. Referring to FIG. 4, a storage node S2 may include a lower electrode 50 covering an exposed surface of a conductive plug 48, first and second stack structures ST1 and ST2 formed on the lower electrode 50, a data storage layer 75 formed between the first and second stack structures ST1 and ST2, and an upper electrode 76 covering an upper surface of the first and second stack structures ST1 and ST2 and the data storage layer 75. The compositions of the first and second stack structures ST1 and ST2 may be the same, but their compositions may also be different. The first stack structure ST1 may include a first insulating layer 70a, a first side electrode 72a, and a second insulating layer 74a, which are sequentially stacked. The second stack structure ST2 may include a third insulating layer 70b, a second side electrode 72b, and a fourth insulating layer 74b, which are sequentially stacked. The materials of the insulating layers 70a, 74a, 70b, and 74b may be the same, but they may also be different. When the insulating layers 70a, 74a, 70b, and 74b are formed of the same material, each insulating layer may be a silicon dioxide layer. In this case, a thickness of each of the insulating layers 70a, 74a, 70b, and 74b may be about 10 nm. The first and second side electrodes 72a and 72b may be used as read voltage applying elements in a read operation of the memory device. The first and second side electrodes 72a and 72b may be composed of a noble metal, for example, platinum (Pt). The data storage layer 75 and the upper electrode 76 may be identical to the data storage layer 58 and the upper electrode 60 of the memory device illustrated in FIG. 3.

Figure 5:
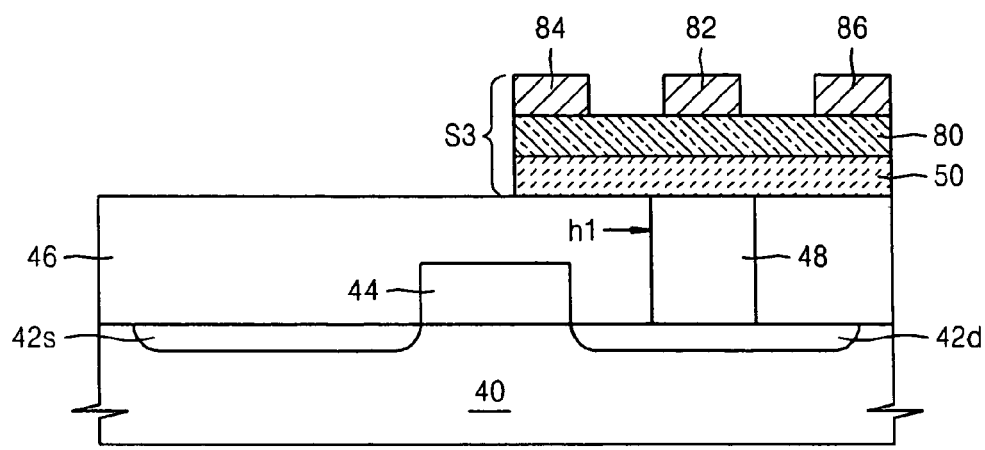

Referring to FIG. 5, in a storage node S3 of a memory device according to other example embodiments, a data storage layer 80 may be formed on a lower electrode 50, and upper electrodes 82, 84, and 86 may be spaced apart on the data storage layer 80. The data storage layer 80 may be identical to the data storage layer 58 of the memory device illustrated in FIG. 3. The first upper electrode 82 may have the same function as that of the upper electrode in FIGS. 3 and/or 4. The second and third upper electrodes 84 and 86 may have the same functions as those of the first and second side electrodes 70b and 72b illustrated in FIG. 4. The second and third upper electrodes 84 and 86 may be used as elements to which a read voltage is applied in a read operation of the memory device. The upper electrodes 82, 84, and 86 may be composed of a noble metal, for example, platinum (Pt).

Figure 6:
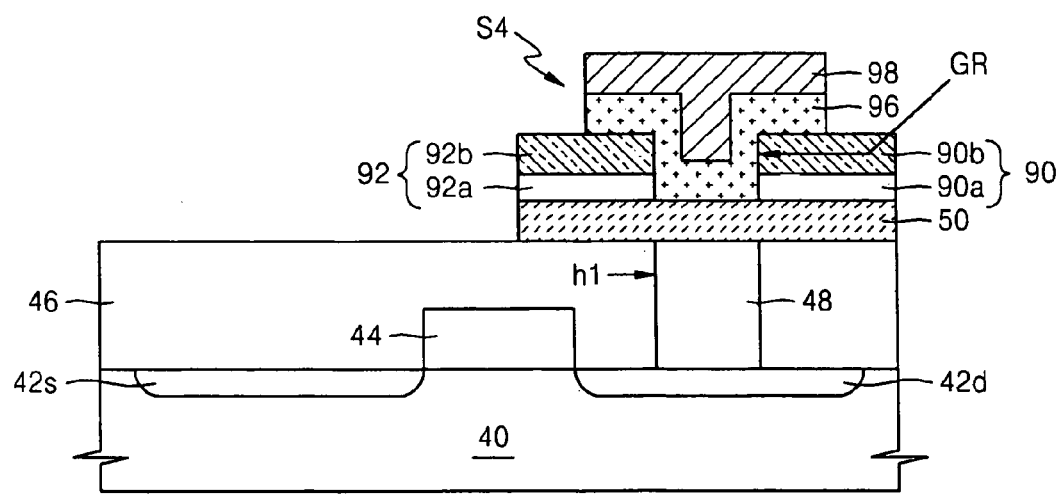

Referring to FIG. 6, in a storage node S4 of a memory device according to other example embodiments, first and second stack structures 90 and 92 are spaced apart on a lower electrode 50. The first stack structure 90 may include a first insulating layer 90a and a first side electrode 90b, which are sequentially stacked. The second stack structure 92 may include a second insulating layer 92a and a second side electrode 92b, which are sequentially stacked. The first and second insulating layers 90a and 92b may be, for example, a silicon dioxide layer. The first and second side electrodes 90b and 92b may be noble metal electrodes (e.g., platinum (Pt)). The lower electrode 50 between the first and second stack structures 90 and 92 may be covered with a data storage layer 96. The data storage layer 96 may cover the sidewalls of the first and second stack structures 90 and 92. The data storage layer 96 may be formed with a thickness that may cover an exposed portion of the lower electrode 50 between the first and second stack structures 90 and 92. However, the data storage layer 96 may not fill a space between the first and second stack structures 90 and 92 and may not cover sidewalls of the first and second stack structures 90 and 92 contacting the exposed portion. The surface of the data storage layer 96 may not be flat causing a recessed portion corresponding to the space between the first and second stack structures 90 and 92. A given insulating layer (not shown), for example, a silicon dioxide layer, may be further provided between the data storage layer 96 and the first and second side electrodes 90b and 92b. An upper electrode 98 may be disposed on an upper surface of the data storage layer 96 while filling the recessed portion of the data storage layer 96.

Figure 7:
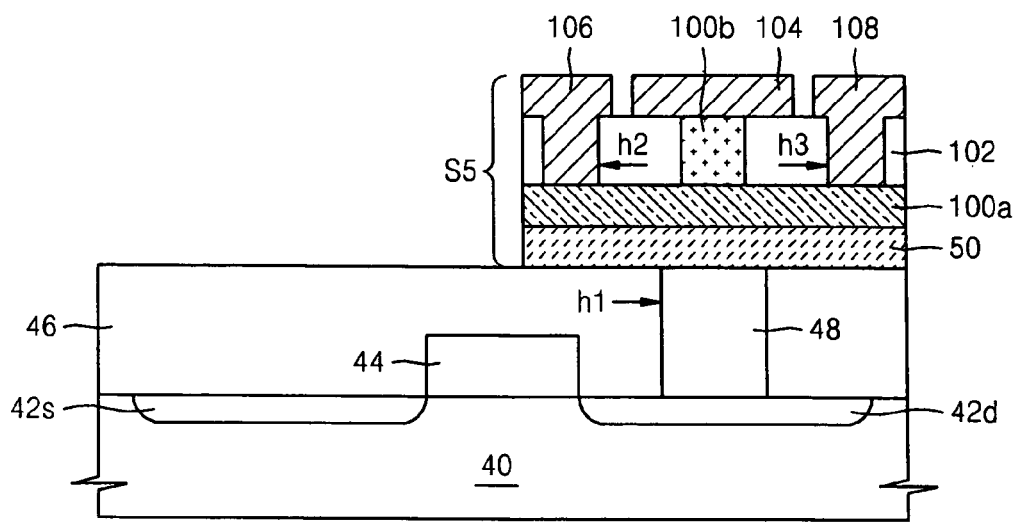

Referring to FIG. 7, in a storage node S5 of a memory device according to other example embodiments, a data storage layer 100a may be provided on a lower electrode 50. The data storage layer 100a may have a portion 100b, which may protrude upward from its upper surface. An interlayer insulating layer 102 may be disposed on the data storage layer 100a around the protruding portion 100b and may be the same height as the protruding portion 100b. The interlayer insulating layer 102 may be a silicon dioxide layer. First and second via holes h2 and h3 may be formed in the interlayer insulating layer 102. The first and second via holes h2 and h3 may be located next to the protruding portion 100b, and the protruding portion 100b may be disposed between the first and second via holes h2 and h3. A portion of the data storage layer 100a around the protruding portion 100b may be exposed through the first via hole h2, and another portion of the data storage layer 100a around the protruding portion 100b may be exposed through the second via hole h3. Upper electrodes 104, 106, and 108 may be formed on the interlayer insulating layer 102. The upper electrodes 104, 106, and 108 may be spaced apart.

The first upper electrode 104 may be formed to cover an upper surface of the protruding portion 100b of the data storage layer 100a, and the second and third upper electrodes 106 and 108 may be provided to fill the first and second via holes h2 and h3, respectively. The upper electrodes 104, 106, and 108 may be composed of a noble metal, for example, platinum (Pt). A write voltage may be applied to the first upper electrode 104 and the lower electrode 50 when recording bit data on the memory device. The second and third upper electrodes 106 and 108 may be used to read the bit data recorded in the memory device. The bit data recorded on the memory device may be read by applying a given read voltage to the second and third upper electrodes 106 and 108.

Figure 8:
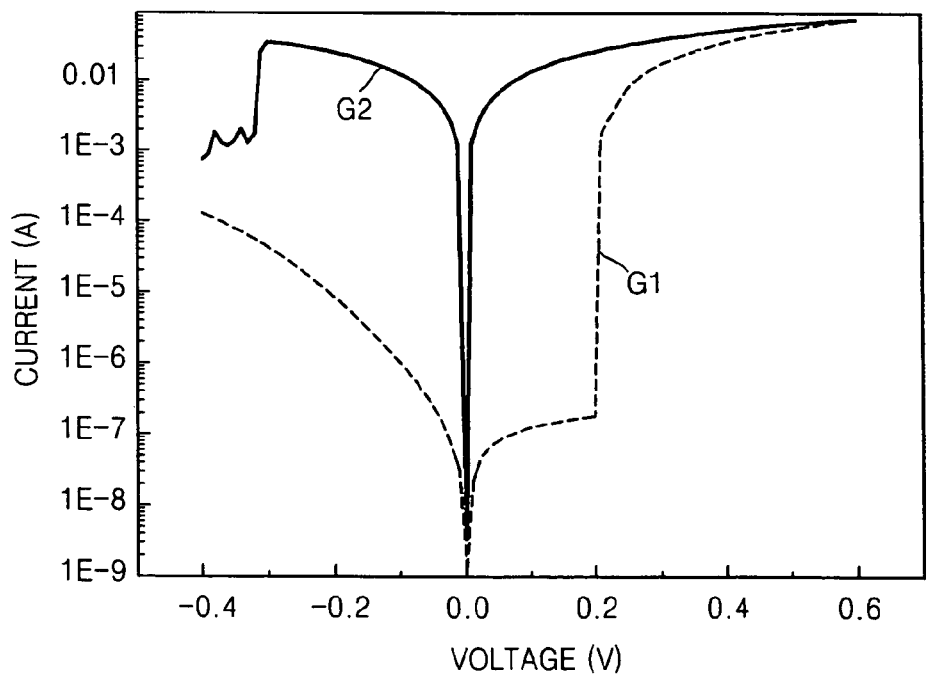

FIG. 8 illustrates change in currents flowing between the lower electrode 50 and the upper electrode 60 through the data storage layer 58 when a voltage is applied to the lower electrode 50 and the upper electrode 60 such that ions are generated from the lower electrode 50 in a state that ions do not exist in the data storage layer 58, and when a voltage is applied to the lower electrode 50 and the upper electrode 60 such that the ions, which have been supplied to the data storage layer 58, are removed.

Lines G1 and G2 of the graph in FIG. 8 illustrate current-voltage characteristics when resistance of the data storage layer 58 is relatively high, and line G1 illustrates current-voltage characteristics when a voltage is applied to the lower electrode 50 and the upper electrode 60 such that ions are supplied to the data storage layer 58. The current-voltage characteristics of the line G1 may be related to a read operation. The line G2 illustrates current-voltage characteristics when a voltage is applied to the lower electrode 50 and the upper electrode 60 such that ions, which have been supplied to the data storage layer 58, are removed. The current-voltage characteristics of the line G2 may be related with an erase operation.

Referring to line G1, a current flowing through the data storage layer 58 may be more rapidly increased when the voltage applied between the lower electrode 50 and the upper electrode 60 becomes about 0.2 V. Therefore, an ion concentration inside the data storage layer 58, and supplied from the lower electrode 50, may be sufficient to electrically connect the lower electrode 50 and the upper electrode 60 when a voltage applied between the lower electrode 50 and the upper electrode 60 is about 0.2 V. Referring to line G2, a current may be increased as soon as voltage is applied between the lower electrode 50 and the upper electrode 60 to remove the ions supplied to the data storage layer 58. The current may be more rapidly decreased when the applied voltage reaches about −0.3 V. When a voltage is applied (e.g., about −0.3 V) between the lower electrode 50 and the upper electrode 60 to remove the ions supplied to the data storage layer 58, the ions supplied to the data storage layer 58 may flow relatively rapidly in a direction opposite to a first supplying direction. When the ion concentration of the data storage layer 58 is decreased, the amount of ions flowing in the direction opposite to the first supplying direction may be reduced.

The concentration of the ions supplied to the data storage layer 58 may be controlled by controlling a voltage applied to the lower electrode 50 and the upper electrode 60. Current-voltage characteristics of the data storage layer 58 in a read operation may be varied in accordance with the concentration of the ions supplied to the data storage layer 58.

Figure 9:
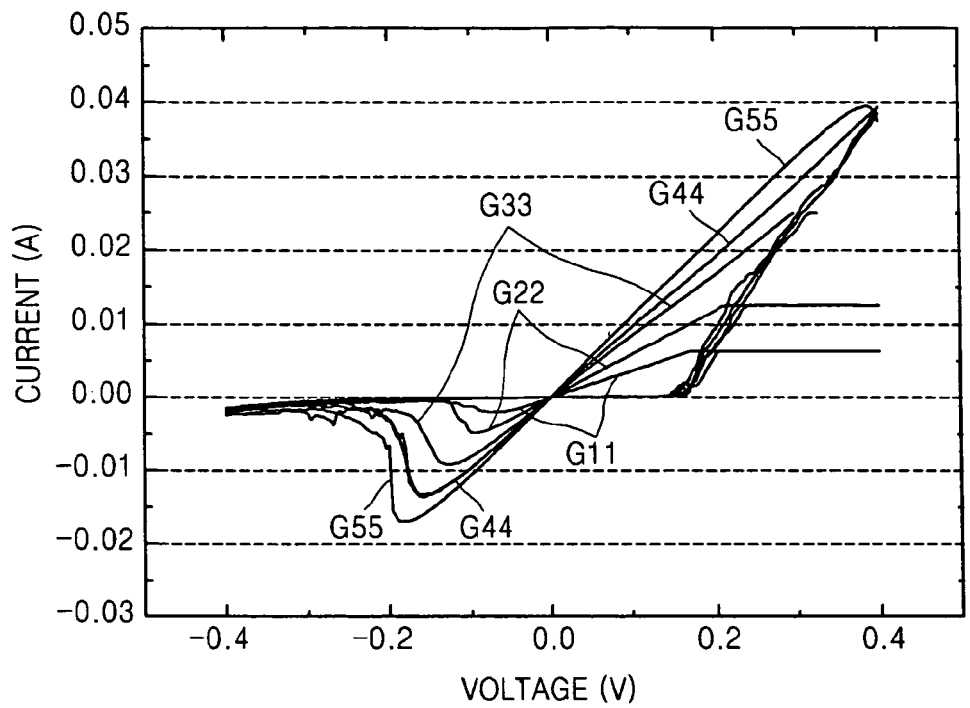

Line G11 of the graph in FIG. 9 illustrates current-voltage characteristics when the data storage layer 58 has a first ion concentration. Lines G22 and G33 illustrate current-voltage characteristics when the data storage layer 58 has a second ion concentration and a third ion concentration, respectively.

Lines G44 and G55 illustrate current-voltage characteristics when the data storage layer 58 has a fourth ion concentration and a fifth ion concentration respectively. The ion concentration of the data storage layer 58 may be increased from the first ion concentration to the fifth ion concentration. Referring to the lines G11-G55, current-voltage characteristics of the data storage layer 58 may vary when the data storage layer 58 has the first-fifth ion concentrations. The data storage layer 58 may have five different resistance states when the data storage layer 58 has the first-fifth ion concentrations. Because the data storage layer 58 may have a sixth ion concentration, a seventh ion concentration and so on, the data storage layer 58 may have more than five resistance states.

Because bit data may be recorded in the data storage layer 58 when the data storage layer has any of the current-voltage characteristics and/or resistance states, multi-bit data may also be recorded in the data storage layer 58. For example, the data storage layer 58 may have the current-voltage characteristics of lines G11-G44 of FIG. 9. If the data storage layer 58 has the current-voltage characteristics of line G11, multi-bit data 00 may be recorded in the data storage layer 58. If the data storage layer 58 has the current-voltage characteristics of line G22, multi-bit data 01 may be recorded in the data storage layer 58. If the data storage layer 58 has the current-voltage characteristics of line G33, multi-bit data 10 may be recorded in the data storage layer 58. If the data storage layer 58 has the current-voltage characteristics of line G44, multi-bit data 11 may be recorded in the data storage layer 58. Because the data storage layer 58 may have eight or more different ion concentrations by controlling a voltage applied to the lower electrode 50 and the upper electrode 60, 3-bit data (e.g., 000, 001, 010, 011, 100, 101, 110 and/or 111), may be recorded in the data storage layer 58. 4-bit data may also be recorded in the data storage layer 58.

Figure 10:
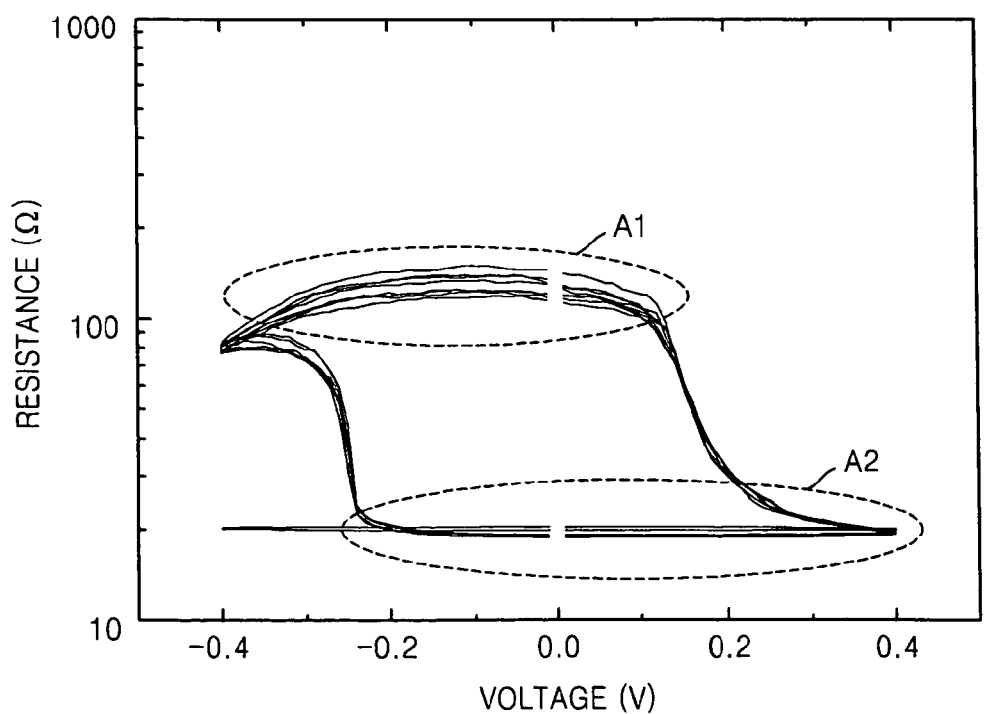

FIG. 10 illustrates voltage-resistance characteristics of the data storage layer 58 reflecting the current-voltage characteristics of FIG. 8 according to example embodiments. A first portion A1 in the graph of FIG. 10 illustrates relatively high resistance of the data storage layer 58 and a second portion A2 illustrates relatively low resistance of the data storage layer 58. The first portion A1 reflects the current-voltage characteristics illustrated when the ion concentration inside the data storage layer 58 is not sufficient to electrically connect the lower electrode 50 and the upper electrode 60. The second portion A2 reflects the current-voltage characteristics illustrated when the ion concentration inside the data storage layer 58 is sufficient to electrically connect the lower electrode 50 and the upper electrode 60.

Referring to FIG. 10, the resistance state of the data storage layer 58 may be relatively high until the applied voltage reaches about 0.2 V. When the applied voltage is about 0.2 V, the resistance of the data storage layer 58 may be decreased. The data storage layer 58 may be in a relatively low resistance state until the applied voltage is about −0.2 V or less. The resistance state of the data storage layer 58 of example embodiments may change after an applied voltage is increased up to a given level. For example, when the data storage layer 58 is a $CuS_x$ layer, resistance of the data storage layer 58 may change when an applied voltage is around about 0.2 V rather than changing immediately upon applying a voltage. According to example embodiments, about 0.2 V of a voltage margin may be ensured in operating the memory device having the $CuS_x$ layer as the data storage layer 58.

If the data storage layer 58 is made of a material including a transition metal and a Group VI element, a sufficient voltage margin may be ensured in the memory device. The material layer may have similar current-voltage characteristics and/or voltage-resistance characteristics as the $CuS_x$ layer.

Figure 11:
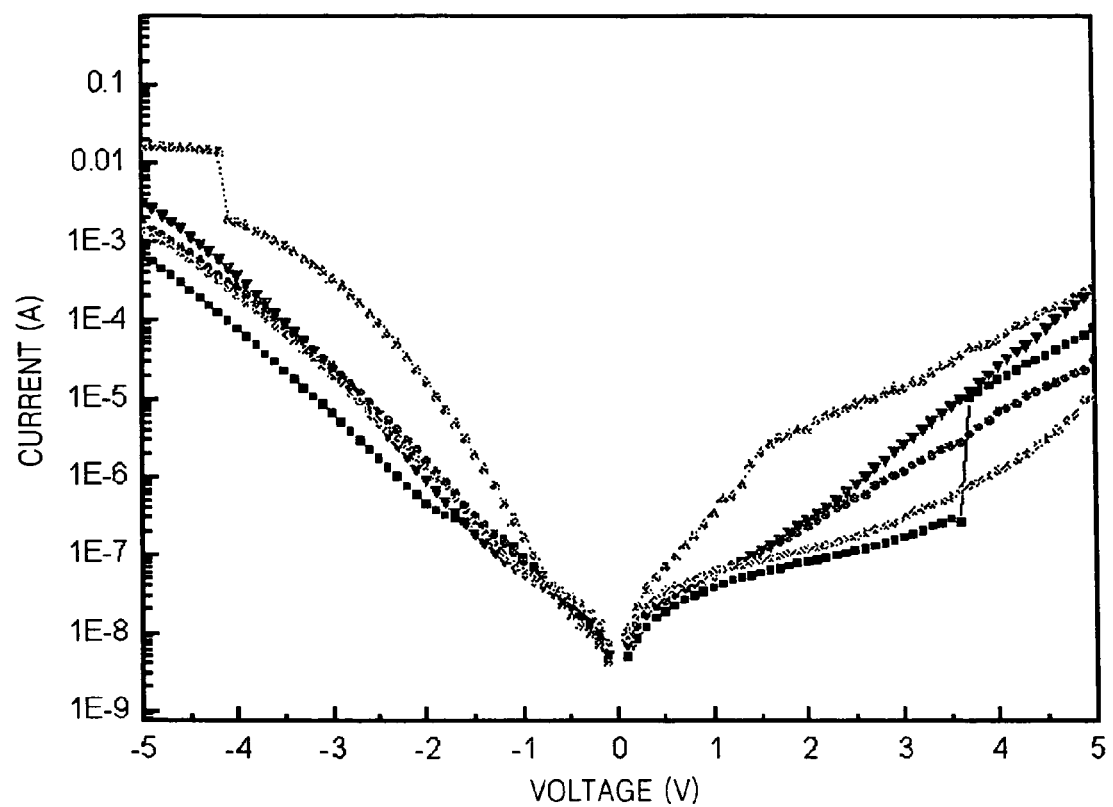
Figure 12:
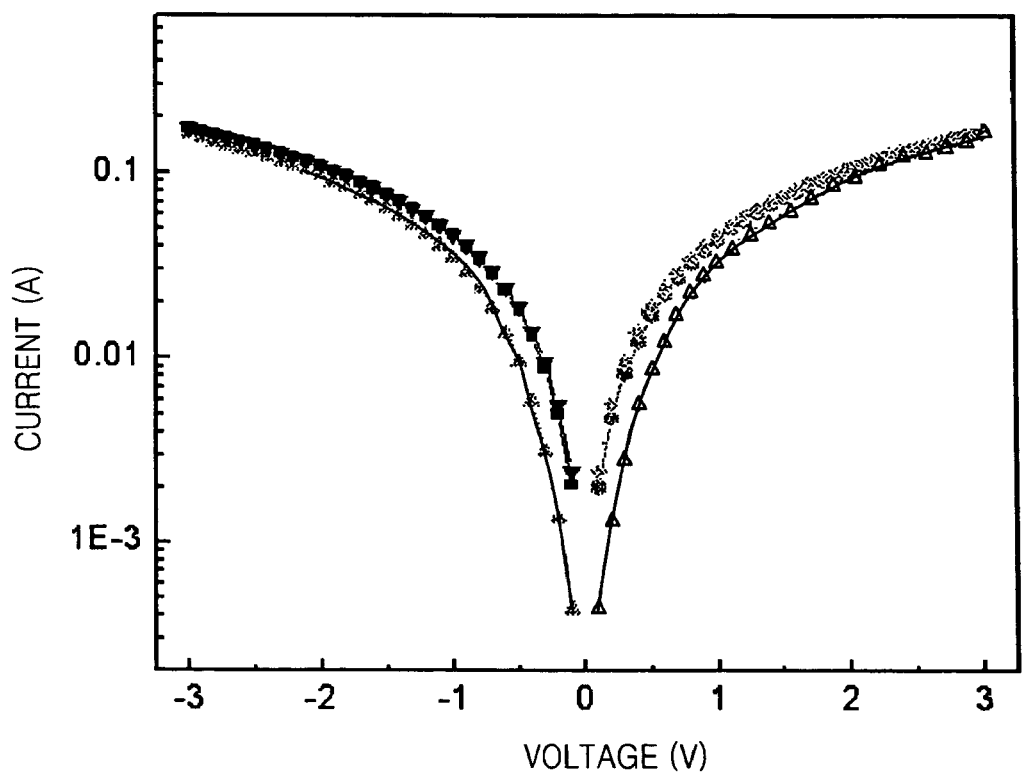

FIG. 11 illustrates current-voltage characteristics measured in the data storage layer 58 when ions are not supplied thereto, and FIG. 12 illustrates current-voltage characteristics measured in the data storage layer 58 having a sufficient ion concentration when ions are supplied thereto. FIGS. 11 and 12 illustrate measurement results that were performed multiple times. In comparing FIGS. 11 and 12, a current measured in the data storage layer 58, having a sufficient ion concentration, may be higher than a current measured in the data storage layer 58 to which ions are not supplied, even at the same voltage (e.g., 1 V). Resistance of the data storage layer 58 may decrease when a sufficient amount of ions is supplied to the data storage layer 58 and if the data storage layer 58 is in a higher resistance state before ions are supplied thereto.

Figure 13:
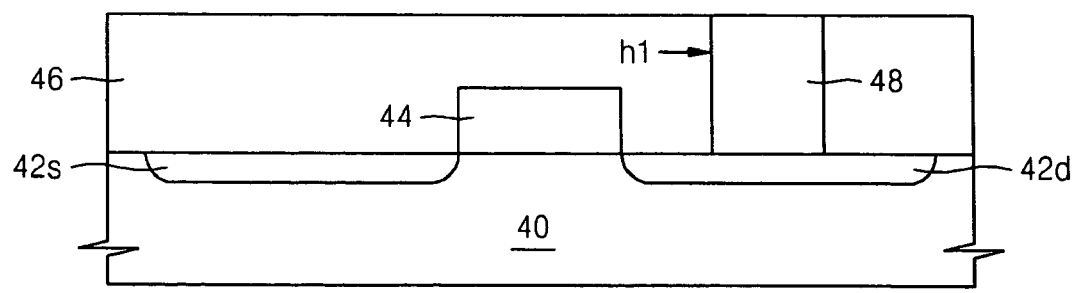

A method of fabricating a memory device according to example embodiments will be explained in reference to FIGS. 13-18. Referring to FIG. 13, a gate stack 44, including a gate electrode (not shown), may be formed on a given portion of a p-type and/or n-type semiconductor substrate 40. First and second impurity regions 42s and 42d may be formed in a given portion of the substrate 40 adjacent to the gate stack 44, which is used as a mask. The first and second impurity regions 42s and 42d may be formed by implanting ions having an opposite polarity to that of the impurities implanted into the substrate 40. A field effect transistor (not shown), including the gate stack 44 and the first and second impurity regions 42s and 42d, may be formed on the substrate 40. After the transistor is formed, an interlayer insulating layer 46 may be formed on the substrate 40 to cover the transistor. A contact hole h1 may be formed in the interlayer insulating layer 46 to expose the second impurity region 42d. The contact hole h1 may be filled with a conductive plug 48.

Figure 14:
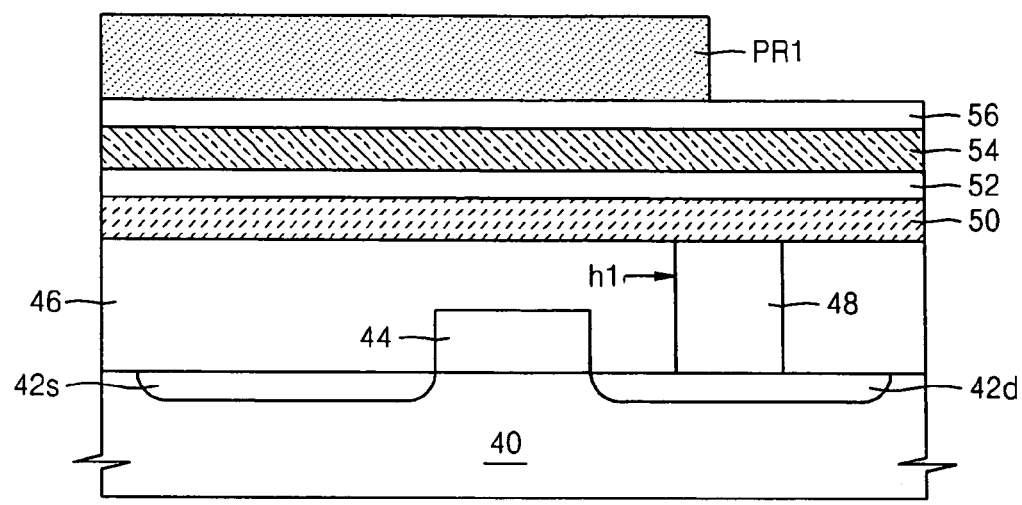
Figure 15:
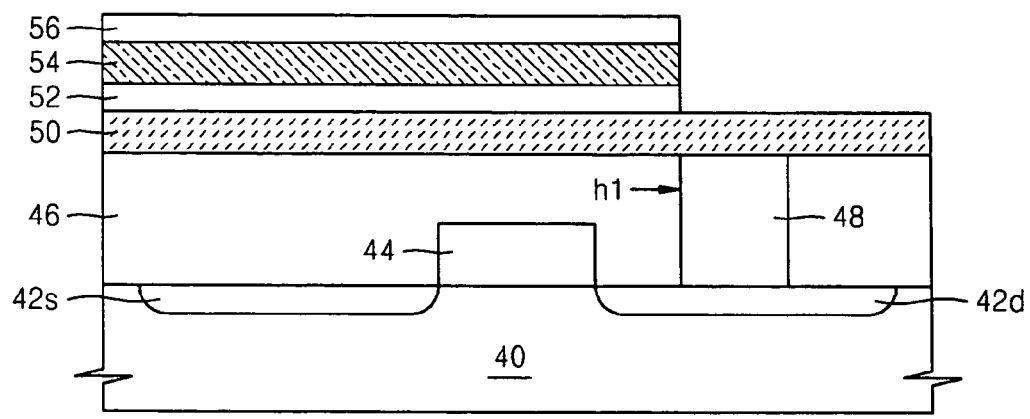

Referring to FIG. 14, a lower electrode 50 may be formed on the interlayer insulating layer 46 to cover an upper surface of the conductive plug 48. When the conductive plug 48 is a polysilicon layer and/or a material layer including an undesirable amount of silicon, a diffusion barrier layer (not shown), for example, a silicon dioxide layer, may be further formed between the lower electrode 50 and the conductive plug 48. The diffusion barrier layer may reduce the amount of silicon diffused into the lower electrode 50. The lower electrode 50, as an ion supplying source, may be composed of a transition metal, for example, copper (Cu). When the lower electrode 50 is composed of a transition metal, the lower electrode 50 may be formed with a thickness greater than about 100 nm. After the lower electrode 50 is formed, a first insulating layer 52, a side electrode 54, and a second insulating layer 56 may be sequentially formed on the lower electrode 50. The first and second insulating layers 52 and 56 may be formed of a given insulating layer, for example, a silicon dioxide layer. The first and second insulating layers 52 and 56 may be formed each with a thickness of about 10 nm. The side electrode 54 may be composed of a given noble metal, for example, platinum (Pt), and may be formed with a thickness of about 100 nm. After the second insulating layer 56 is formed, a photoresitive layer pattern PR1 may be formed on the second insulating layer 56 to expose a portion of the second insulating layer 56. The exposed portion of the second insulating layer 56 may be etched using the photoresitive layer pattern PR1 as an etch mask. After the second insulating layer 56 is etched, the side electrode 54 and the first insulating layer 50 formed below the exposed portion of the second insulating layer 56 may be sequentially etched. The etching may be performed until the lower electrode 50 is exposed and the photoresitive layer pattern PR1 may be removed after etching. An exposed portion of the upper surface of the lower electrode 50 is as illustrated in FIG. 15.

Figure 16:
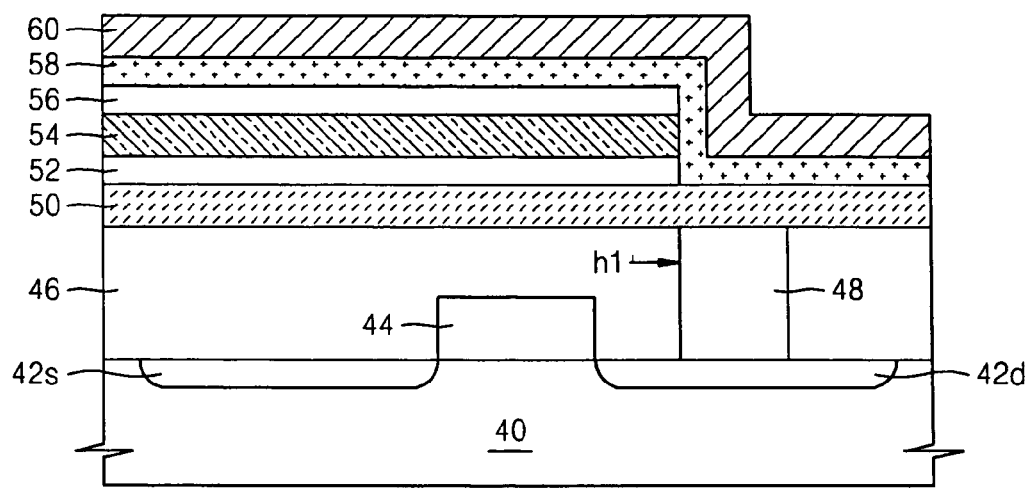

Referring to FIG. 16, a data storage layer 58 may be formed on the exposed portion of the lower electrode 50 exposed by the etching. The data storage layer 58 may be formed on sidewalls of the first and second insulating layers 52 and 56 and a sidewall of the side electrode 54 exposed by the etching, and an upper surface of the second insulating layer 56. The data storage layer 58 formed as above may be a compound layer including a transition metal and/or a Group V element. For example, the data storage layer 58 may be formed of a copper sulfide layer ($CuS_x$) (0.4<x<0.6) layer including copper (Cu) as the transition metal and sulfur (S) as the Group V element. An upper electrode 60 may be formed on the data storage layer 58. The upper electrode 60 may be formed of a noble metal layer, for example, a platinum layer. The upper electrode 60 may be formed of a single noble metal layer, but may be formed of a double layer including a noble metal layer and a titanium compound layer in order to reduce the amount of silicon diffused into the upper electrode 60. The titanium compound layer may be formed of, for example, a TiAlN layer.

Figure 17:
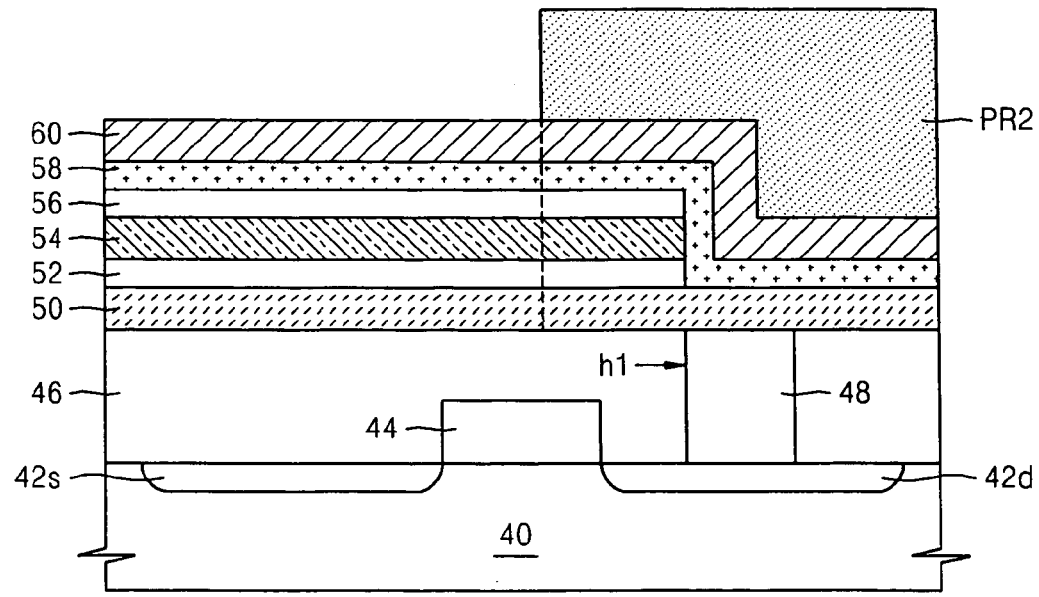

Referring to FIG. 17, a photoresitive layer pattern PR2 may be formed on a portion of the upper electrode 60. The photoresitive layer pattern PR2 may be formed at the position covering the conductive plug 48, the exposed portion of the lower electrode 50 exposed by the etching, and a portion of the second insulating layer 56 adjacent to the exposed portion of the lower electrode 50. An exposed portion of the upper electrode 60 may be etched using the photoresitive layer pattern PR2 as an etch mask. The etching may be performed until the interlayer insulating layer 46 is exposed. After the exposed portion of the upper electrode 60 is etched during the etching process, the second insulating layer 56, the side electrode 54, the first insulating layer 52, and the lower electrode 50 may be sequentially etched. The etching may be performed by changing the etch conditions such that an etch rate of each material is increased.

Figure 18:
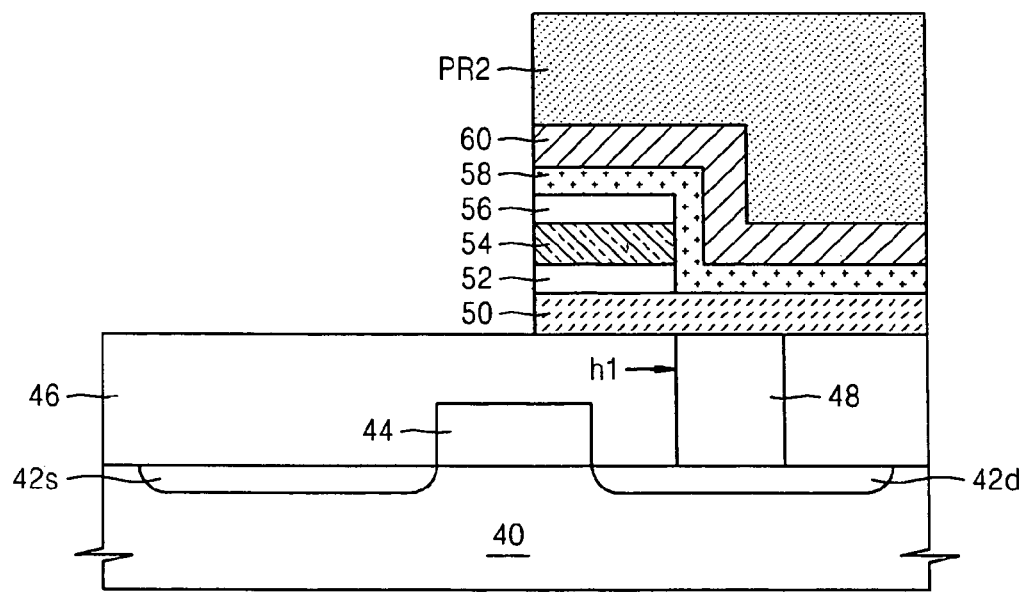

FIG. 18 illustrates the results of the above etching process according to example embodiments. Referring to FIG. 18, as etching progresses using the photoresitive layer pattern PR2 as an etch mask, the lower electrode 50, the first insulating layer 52, the side electrode 54, the second insulating layer 56, the data storage layer 58, and the upper electrode 60 around the photosensitive layer pattern PR2 may all be removed. The lower electrode 50 may remain on the conductive plug 48 and a portion of the interlayer insulating layer 46 around the conductive plug 48, and a stack structure including the first insulating layer 52, the side electrode 54, and the second insulating layer 56 may remain only on a portion of the lower electrode 50. The data storage layer 58 may cover the exposed portion of the lower electrode 50 where the stack structure does not exist, a sidewall of the stack structure and an upper surface of the second insulating layer 56. The upper electrode 60 may cover the data storage layer 58.

After etching using the photoresitive layer pattern PR2 as an etch mask and the photoresitive layer pattern PR2 is removed, the memory device of example embodiments as illustrated in FIG. 3 may be formed.

Figure 19:
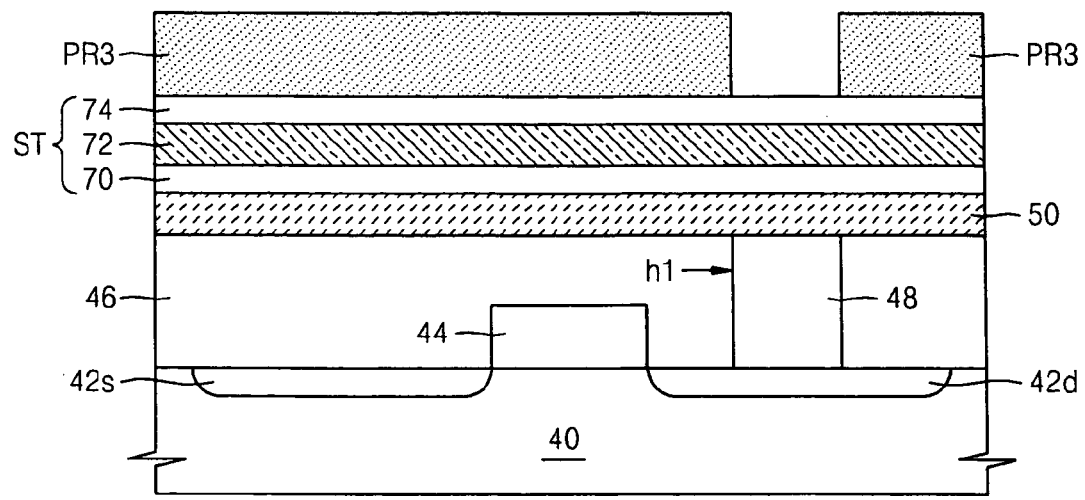
Figure 20A:
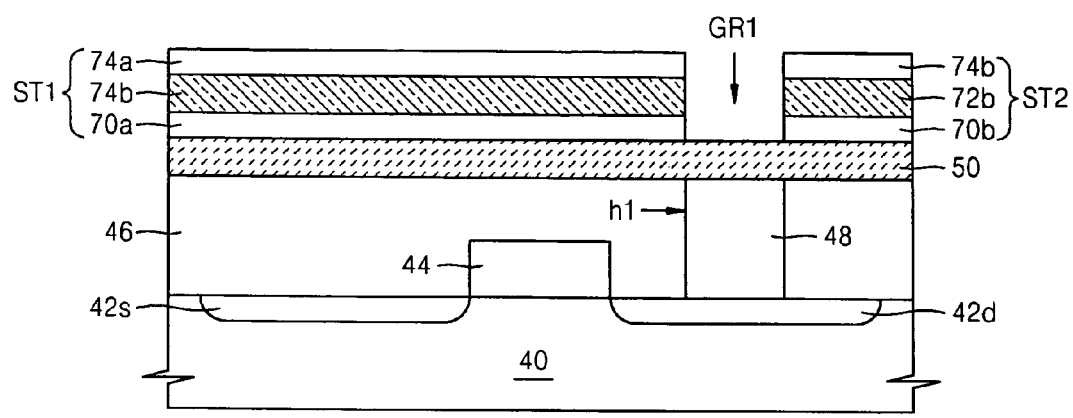

Referring to FIG. 19, a lower electrode 50 may be formed on an interlayer insulating layer 46 to cover an exposed portion of a conductive plug 48. A lower insulating layer 70, a side electrode layer 72, and an upper insulating layer 74 are sequentially stacked on the lower electrode 50. The lower and upper insulating layer 70 and 74 may be formed of an identical material to the first and second insulating layers 52 and 56 in the method of fabricating the first memory device. The side electrode layer 72 may be composed of the same material as that of the side electrode 54 in the method of fabricating the first memory device. A photoresitive layer pattern PR3 may be formed on a portion of the upper insulating layer 74. The photoresitive layer pattern PR3 may be formed to expose a portion of the upper insulating layer 74, which is disposed right over the conductive plug 48. The exposed portion of the upper insulating layer 74 is etched using the photoresitive layer pattern PR3 as an etch mask, and the side electrode layer 72 and the lower insulating layer 70, which are disposed therebelow, are sequentially etched while changing etch conditions. The etching is performed until the lower electrode 50 is exposed. The photoresitive layer pattern PR3 is removed. By the etching, a groove GR1 may be formed in the stack structure ST, which is composed of the lower insulating layer 70, the side electrode layer 72, and the upper insulating layer 74, and the groove GR1 divides the stack structure ST into a first stack structure ST1 and a second stack structure ST2 as illustrated in FIG. 20A.

When the groove GR1 is formed in the stack structure ST, the lower insulating layer 70, the side electrode layer 72, and the upper insulating layer 74 are respectively divided into two portions. That is, the lower insulating layer 70 is divided into first and second lower insulating layers 70a and 70b, and the side electrode layer 72 is divided into first and second side electrodes 72a and 72b. The upper insulating layer 74 is divided into first and second upper insulating layers 74a and 74b. The first stack structure ST1 may include the first lower insulating layer 70a, the first side electrode 72a and the first upper insulating layer 74a, which are sequentially stacked. The second stack structure ST2 may include the second lower insulating layer 70b, the second side electrode 72b and the second upper insulating layer 74b, which are sequentially stacked.

Figure 20B:
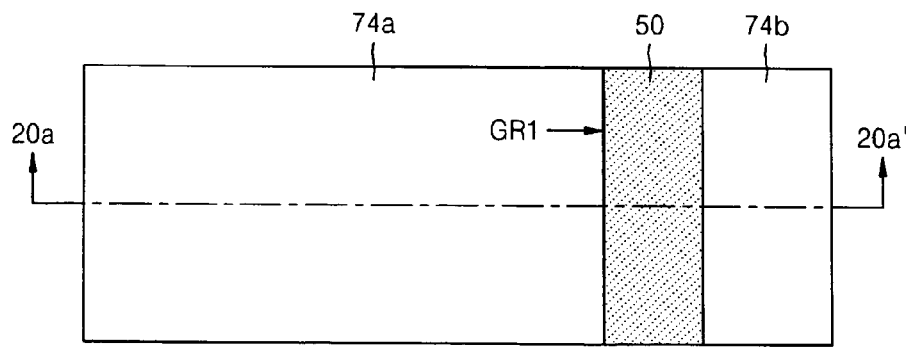

FIG. 20B is a diagram illustrating the resultant structure where the groove GR1 may be formed according to example embodiments. Referring to FIG. 20B, the lower electrode 50 may be exposed through the groove GR1 and the upper insulating layer 74 may be divided into first and second upper insulating layers 74a and 74b. FIG. 20A is a diagram of line 20a-20a' of FIG. 20B.

Figure 21:
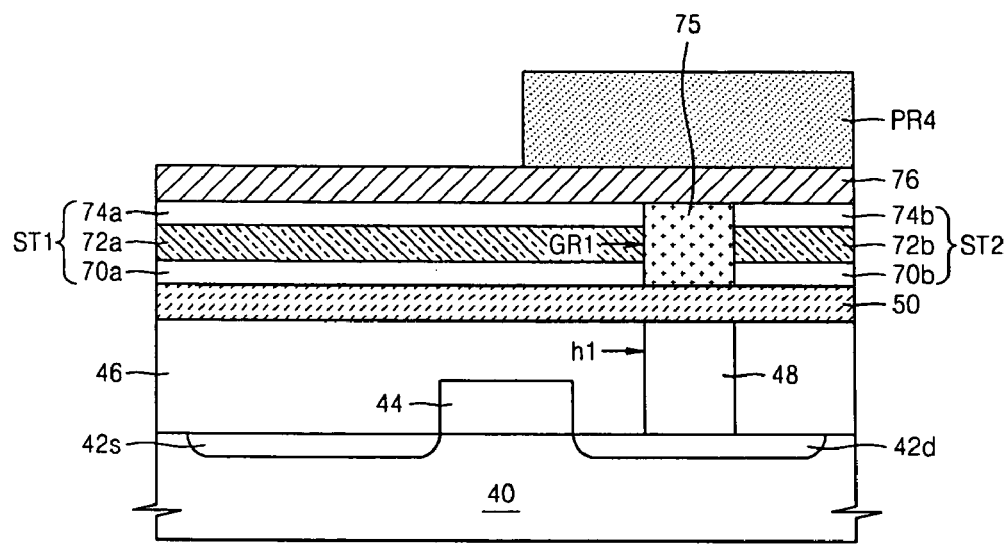
Figure 22:
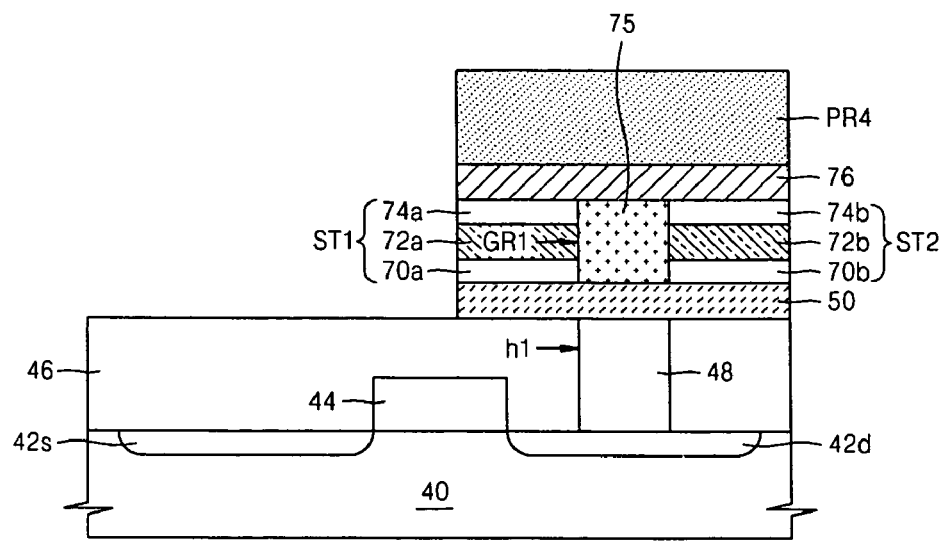

Referring to FIG. 21, the groove GR1 may be filled with a data storage layer 75. After the groove GR1 is filled with the data storage layer 75, an upper electrode 76 may be formed on the first and second upper insulating layers 74a and 74b to cover the data storage layer 75. A photoresitive layer pattern PR4 may be formed on the upper electrode 76. The photosensitive layer pattern PR4 may be formed over the data storage layer 75 and a portion of the upper electrode 76 around the data storage layer 75. The upper electrode 76 around the photoresitive layer pattern PR4 may be etched using the photoresitive layer pattern PR4 as an etch mask. The lower material layers may be exposed after the upper electrode 76 is etched while etch conditions change in accordance with the respective lower material layers. The etching may be performed until the interlayer insulating layer 46 is exposed. The lower electrode 50, the first and second stack structures ST1 and ST2, and the upper electrode 76 around the photosensitive layer pattern PR4 may be removed as a result of the etching as illustrated in FIG. 22. If the photosensitive layer pattern PR4 is removed, the memory device as illustrated in FIG. 4 may be fabricated.

The memory device illustrated in FIG. 5 may be fabricated by sequentially forming the lower electrode 50 and the data storage layer 80, and then, confining the data storage layer 80 and the lower electrode 50 to the shape illustrated in FIG. 5 using a photolithography process and an etch process. An upper electrode (not shown) may be formed on the data storage layer 80. The upper electrode may be etched using an etch mask which divides the upper electrodes 82, 84, and 86 as illustrated in FIG. 5, thereby forming the upper electrodes 82, 84, and 86 on the data storage layer 80.

The memory device illustrated in FIG. 6 will be fabricated by sequentially forming a lower electrode 50, an insulating layer (not shown), which will be divided into first and second insulating layers 90a and 92a, and an electrode layer (not shown) which will be divided into first and second side electrodes 90b and 92b. A groove GR may be formed in the electrode layer and the insulating layer to expose the lower electrode 50. When the groove GR is formed, the insulating layer may be divided into first and second insulating layers 90a and 92a, and the electrode layer may be divided into first and second side electrodes 90b and 92b. A data storage layer 96 may be formed on the lower electrode 50, exposed through the groove GR, to extend onto the first and second side electrodes 90b and 92b. An upper electrode 98 may be formed on the data storage layer 96. The data storage layer 96 may be formed to cover sidewalls of the first and second insulating layers 90a and 92a, and sidewalls of the first and second side electrodes 90b and 92b, which are exposed through the groove GR. The data storage layer 96 and the upper electrode 98 may be etched to partially expose the first and second side electrodes 90b and 92b as illustrated in FIG. 5.

The memory device illustrated in FIG. 7 will be fabricated by forming a data storage material layer (not shown), which will be patterned to a data storage layer 100a and 100b after a lower electrode 50 is formed on an interlayer insulating layer 46 to cover a conductive plug 48. After an etch mask (not shown) is formed on a given portion of the data storage material layer corresponding to the position where a protruding portion 100b of the data storage layer 100a may be formed, the data storage material layer may be etched. The etching may be performed until thickness of the data storage material layer around the etch mask becomes equal to a thickness around the protruding portion 100b of the data storage layer 100a illustrated in FIG. 7. If the etch mask is removed, the data storage material layer may be formed as the data storage layer 100a and 100b of FIG. 7. An interlayer insulating layer 102 may be formed at the same height as that of the protruding portion 100b on the data storage layer 100a. First and second via holes h2 and h3 may be formed in the interlayer insulating layer 102. An electrode layer (not shown) may be formed on the interlayer insulating layer 102 to fill the first and second via holes h2 and h3. After an etch mask is formed on the electrode layer to confine positions where upper electrodes 104, 106, and 108 may be formed, the electrode layer may be etched and the etch mask may be removed. The electrode layer may be divided into the upper electrodes 104, 106, and 108.

Referring to FIG. 23, a write voltage Vw may be applied between a lower electrode 50 and an upper electrode 60 so that a transistor Tr may be maintained in an on-state. If a material of a data storage layer 58 is determined, a write voltage Vw may be determined as a given voltage by considering electrical characteristics of FIG. 8. However, if multi-bit data is to be recorded in the data storage layer 58 illustrated in FIG. 9, a write voltage Vw may be varied in accordance with the multi-bit data to be recorded. For example, if multi-bit data 00 is to be recorded in the data storage layer 58, a write voltage Vw may be applied such that the data storage layer 58 has current-voltage characteristics of the line G11 of FIG. 9. If multi-bit data 01 is to be recorded in the data storage layer 58, a write voltage Vw may be applied such that the data storage layer 58 has current-voltage characteristics similar to the line G22 of FIG. 9. When the write voltage Vw is applied, ions may be supplied from the lower electrode 50 to the data storage layer 58. The ions supplied as above may remain inside the data storage layer 58 until an erase voltage is applied between the lower electrode 50 and the upper electrode 60. With the existence of the ions inside the data storage layer 58, the bit data recorded in the data storage layer 58 by the write voltage Vw may be maintained until the erase voltage is applied.

An arrow AA1 of FIG. 23 crossing the lower electrode 50, the data storage layer 58, and the upper electrode 60 may indicate a write direction. The write direction may be similar to a direction of ions when the write voltage Vw is applied.

The write method may be employed in the same way to the memory device illustrated in FIGS. 4-7. An erase voltage may be applied to completely remove the former data recorded in the data storage layer 58 before a write voltage Vw is applied between the lower electrode 50 and the upper electrode 60.

Referring to FIG. 24, a given read voltage Vr may be applied between a side electrode 24 and an upper electrode 60 in a state where a lower electrode 50 is hovering, so as to measure resistance of a data storage layer 58. Resistance of the data storage layer 58, when ions supplied from the lower electrode 50 during the write operation exist in the data storage layer 58 (hereinafter, referred to as first resistance) may be lower than resistance of the data storage layer 58 when ions do not exist in the data storage layer 58 (hereinafter, referred to as a second resistance). Resistance of the data storage layer 58 may be measured by applying a read voltage Vr as compared with a reference resistance having an intermediate value between the first and second resistances in a comparator (not shown) connected to the memory device. The bit data recorded in the data storage layer 58 may be read by the comparison. When multi-bit data is recorded in the data storage layer 58, the measured resistance of the data storage layer 58 may be compared with a reference resistance set in a plurality of comparators having different reference resistance values respectively. By the comparison, multi-bit data in the data storage layer 58 may be read.

The side electrode 54 and the upper electrode 60, which are composed of noble materials, may not react with ions existing inside the data storage layer 58. The ions existing inside the data storage layer 58 during the read operation may be moved horizontally between the upper electrode 60 and the side electrode 54, but may not leave completely. After the read operation, the ion concentration may remain the same inside the data storage layer 58 as before the read operation. The bit data recorded in the data storage layer 58 after the read operation may maintain the same value as that before the read operation.

The read operation may be processed along the direction perpendicular to a write direction AA1 of the write operation illustrated in FIG. 23. An arrow AA2 of FIG. 24 indicates a read operation direction. The read operation direction AA2 may be the same as the direction of ions during a read operation. But, a read voltage Vr applied between the side electrode 56 and the upper electrode 60 during the read operation may be applied opposite to that illustrated in the drawing.

In a memory device according to example embodiments, for example, the memory device having two side electrodes in FIG. 4, a read voltage may be applied between the first and second side electrodes 72a and 72b. An erase voltage applied between the lower electrode 50 and the upper electrode 60 during an erase operation of the memory device of example embodiments may be applied in the direction opposite to that of the write voltage Vw. The ions in the data storage layer 58 may be moved to the lower electrode 50 by the erase voltage.

As described above, the memory device according to example embodiments may reduce or minimize a change in the amount of ions during a read operation because the direction of ions during a write operation is perpendicular to the direction of ions during a read operation. Change in resistance, in accordance with a voltage applied for a read operation, may be decreased, and thus, sufficient margins during read and write operations may be ensured. Because ion concentration in a data storage layer or an ion conductive layer during a write operation may be controlled, multi-bit data may be stored.

While example embodiments have been particularly shown and described with reference to example embodiments thereof, it will be understood by those of ordinary skill in the art that the embodiments are just examples of embodiments rather than defining the scope of the claims. Those of ordinary skill in the art may make other storage nodes as well as the storage node described as above based on the technical spirit of example embodiments. They may make a switching element having another structure than the transistor described as above. Various changes in form and details may be made therein without departing from the spirit and scope of the following claims.

What is claimed is:

1. A non-volatile memory device including a storage node, the storage node comprises:
    a lower electrode;
    a data storage layer on the lower electrode;
    at least one side electrode connected to the data storage layer; and
    at least one upper electrode on the data storage layer,
    wherein the data storage layer is in contact with a portion of an upper surface of the lower electrode,
    the at least one side electrode is spaced from the lower electrode, and
    the lower electrode is separated from the upper electrode.

2. The non-volatile memory device of claim 1, wherein the at least one upper electrode are spaced from the at least one side electrode.

3. The non-volatile memory device of claim 2, further comprising:
    a first insulating layer disposed between the at least one side electrode and the lower electrode forming a stack structure.

4. The non-volatile memory device of claim 2, further comprising:
    a second insulating layer disposed between the at least one side electrode and the data storage layer.

5. The non-volatile memory device of claim 4, wherein the first and second insulating layers are silicon dioxide ($SiO_2$) layers.

6. The non-volatile memory device of claim 4, wherein the data storage layer extends onto the second insulating layer.

7. The non-volatile memory device of claim 1, further comprising:
    a substrate; and
    a switching element formed in the substrate and connected to the storage node via the lower electrode.

8. The non-volatile memory device of claim 1, wherein the data storage layer is a compound layer including a transition metal and a Group V element.

9. The non-volatile memory device of claim 8, wherein the compound layer is one selected from the group including a $CuS_x$ layer (0.4<x<0.6), a tungsten oxide layer, and a titanium oxide layer.

10. The non-volatile memory device of claim 2, wherein the at least one side electrode and the at least one upper electrode are noble metal layers.

11. The non-volatile memory device of claim 10, wherein the noble metal layers are platinum (Pt).

12. The non-volatile memory device of claim 2, wherein the data storage layer extends onto the at least one side electrode.

13. The non-volatile memory device of claim 12, further comprising:
    an insulating layer disposed between the at least one side electrode and the lower electrode.

14. The non-volatile memory device of claim 1, wherein the at least one upper electrode and the lower electrode are spaced apart vertically, and at least two side electrodes are spaced apart horizontally.

15. A non-volatile memory device including a storage node, the storage node comprising:
    a lower electrode;
    a data storage layer on the lower electrode;
    an upper electrode on the data storage layer; and
    first and second side electrodes spaced apart from each other and from the upper electrode and the lower electrode, a portion thereof being connected to the data storage layer;
    wherein the data storage layer is in contact with a portion of an upper surface of the lower electrode, and
    the lower electrode is separated from the upper electrode.

16. The non-volatile memory device of claim 15, wherein the data storage layer includes a protruding portion, and the upper electrode is formed on the protrusion portion.

17. The non-volatile memory device of claim 16, further comprising:
    an interlayer insulating layer disposed on the data storage layer around the protruding portion, and the first and second side electrodes connected to the data storage layer through the interlayer insulating layer.

18. The non-volatile memory device of claim 15, wherein the data storage layer extends onto the first and second side electrodes.

19. The non-volatile memory device of claim 18, further comprising:
    an insulating layer disposed between the first and second side electrodes and the lower electrode.

20. A method of fabricating a non-volatile memory device including a storage node, the method comprising:
    forming a lower electrode on an interlayer insulating layer;
    forming a data storage layer on the lower electrode;
    connecting at least one side electrode to the data storage layer; and
    forming at least one upper electrode on the data storage layer, wherein the data storage layer is in contact with a portion of an upper surface of the lower electrode,
    the at least one side electrode is spaced from the lower electrode, and
    the lower electrode is separated from the upper electrode.

21. The method of claim 20, further comprising a first insulating layer disposed between the at least one side electrode and the lower electrode forming a stack structure.

22. The method of claim 20, further comprising a first insulating layer disposed between the at least one side electrode and the lower electrode forming a stack structure; and
    a second insulating layer disposed between the at least one side electrode and the data storage layer.

23. The method of claim 22, wherein the first and second insulating layers are silicon dioxide ($SiO_2$) layers.

24. The method of claim 20, further comprising:
forming a switching element connected to the lower electrode on a substrate;
forming the interlayer insulating layer covering the switching element on the substrate.

25. The method of claim 21, wherein removing the portion of the stack structure so as to expose the lower electrode includes forming a groove dividing the stack structure into two portions.

26. The method of claim 25, wherein the data storage layer is formed to fill the groove.

27. The method of claim 20, wherein the data storage layer is a compound layer including a transition metal and a Group V element.

28. The method of claim 27, wherein the compound layer is a $CuS_x$ layer ($0.4<x<0.6$).

29. The method of claim 20, wherein the lower electrode is a transition metal layer, and the at least one upper electrode is a noble metal layer.

30. The method of claim 20, wherein the data storage layer extends onto a portion of the at least one layer.

31. The method of claim 20, wherein forming the at least one upper electrode on the data storage layer further comprises:
forming a data storage layer including a protruding portion;
forming at least one interlayer insulating layer on the data storage layer around the protruding portion;
forming at least one via hole to be filled with the at least one upper electrode in the interlayer insulating layer and covering the protruding portion of the data storage layer; and
removing the at least one upper electrode except for portions of the at least one upper electrode filling the at least one via hole, portions thereof around the at least one via hole, and a portion thereof covering the protruding portion.

32. The method of claim 31, wherein the data storage layer is formed of a compound layer including a transition metal and a Group V element.

33. The method of claim 31, wherein the lower electrode is a transition metal layer, and the at least one upper electrode is a noble metal layer.

34. A method of fabricating a non-volatile memory device, comprising:
forming a lower electrode on an interlayer insulating layer;
forming a data storage layer on the lower electrode; and
forming a plurality of upper electrodes on the data storage layer, wherein the plurality of upper electrodes are separated from each other by forming a plurality of openings therebetween.

35. The method of claim 25, wherein the forming of the plurality of upper electrodes on the data storage layer further comprises:
forming a protruding portion in the data storage layer;
forming an interlayer insulating layer on the data storage layer around the protruding portion;
forming first and second via holes to be filled with the second and third upper electrodes in the interlayer insulating layer;
forming an upper electrode layer filling the first and second via holes and covering the protruding portion on the interlayer insulating layer; and
removing the upper electrode layer except for portions of the upper electrode layer filling the first and second via holes, portions thereof around the first and second via holes, and a portion thereof covering the protruding portion.

36. A method of writing and operating the non-volatile memory device of claim 7, the method comprising:
maintaining the switching element in an on-state; and
applying a write voltage between the at least one upper electrode and the lower electrode.

37. The method of claim 36, wherein
applying the write voltage between the at least one upper electrode and the lower electrode, thereby recording data in the data storage layer.

38. The method of claim 36, further comprising:
applying an erase voltage before applying the write voltage.

39. The method of claim 36, further comprising:
after applying the write voltage,
floating the lower electrode; and
applying a read voltage between the at least one upper electrode and the lower electrode, thereby reading data recorded in the data storage layer.

40. The method of claim 36, further comprising:
after applying the write voltage,
floating the at least one upper electrode and the lower electrode; and
applying a read voltage between the at least one upper electrode and the lower electrode.

41. A non-volatile memory device including a switching element and a storage node connected to the switching element, the storage node comprises:
a lower electrode;
a data storage layer on the lower electrode; and
a plurality of upper electrodes on the data storage layer,
wherein the plurality of upper electrodes are separated from each other by forming a plurality of openings therebetween.

42. The non-volatile memory device of claim 41, wherein the data storage layer has a protruding portion connected to one of the plurality of upper electrodes.

* * * * *